US012243710B2

(12) United States Patent
Tajima

(10) Patent No.: US 12,243,710 B2
(45) Date of Patent: Mar. 4, 2025

(54) ELECTRON BEAM IRRADIATION APPARATUS WITH OVERLAPPING BEAM COLUMNS AND HELPING COLUMNS

(71) Applicant: EBARA CORPORATION, Tokyo (JP)

(72) Inventor: Ryo Tajima, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 16/909,104

(22) Filed: Jun. 23, 2020

(65) Prior Publication Data

US 2020/0411275 A1    Dec. 31, 2020

(30) Foreign Application Priority Data

Jun. 28, 2019    (JP) .................... 2019-120613

(51) Int. Cl.
*H01J 37/147* (2006.01)
*H01J 37/317* (2006.01)

(52) U.S. Cl.
CPC ...... *H01J 37/1474* (2013.01); *H01J 37/3177* (2013.01)

(58) Field of Classification Search
None
See application file for complete search history.

(56) References Cited

U.S. PATENT DOCUMENTS

| | | |
|---|---|---|
| 5,384,463 A | 1/1995 | Honjo et al. |
| 2010/0072403 A1 | 3/2010 | Abe et al. |
| 2012/0286170 A1 * | 11/2012 | Van De Peut ...... H01J 37/3002 250/397 |
| 2013/0009057 A1 | 1/2013 | Yokosuka et al. |
| 2015/0311035 A1 | 10/2015 | Norikane |
| 2016/0126062 A1 * | 5/2016 | Muraki ............... H01J 37/3177 250/492.3 |
| 2016/0195805 A1 * | 7/2016 | Fujimura ............... G06F 30/20 716/52 |
| 2018/0233374 A1 | 8/2018 | Tajima et al. |

(Continued)

FOREIGN PATENT DOCUMENTS

| | | |
|---|---|---|
| EP | 3460825 A1 | 3/2019 |
| JP | H05-275322 A | 10/1993 |
| JP | H07-192682 A | 7/1995 |

(Continued)

*Primary Examiner* — Andrew Smyth
(74) *Attorney, Agent, or Firm* — Chrisman Gallo Tochtrop LLC

(57) ABSTRACT

A electron beam irradiation apparatus 1 includes a helping column determination unit 11 that determines, as a helping column, a column having a main irradiation area that is not included in a target irradiation area to be irradiated with an electron beam from among a plurality of columns 2 when information on the target irradiation area is input, and a helped column determination unit 12 that determines, as a helped column for the determined helping column, a column that is adjacent to the helping column and has a main irradiation area included in the target irradiation area from among the plurality of columns 2. A beam scanner 5 of the helping column performs a helping irradiation control for performing electron beam irradiation in the sub-irradiation area of the helping column, thereby irradiating the target irradiation area of the helped column with an electron beam.

7 Claims, 4 Drawing Sheets

(56) References Cited

U.S. PATENT DOCUMENTS

2019/0066975 A1 2/2019 Matsumoto
2019/0198293 A1* 6/2019 Ogasawara ......... H01J 37/3177

FOREIGN PATENT DOCUMENTS

| JP | 2010-098294 A | 4/2010 |
| JP | 2018-133243 A | 8/2018 |
| TW | 201830449 A | 8/2018 |
| TW | 201921413 A | 6/2019 |

* cited by examiner

ELECTRON BEAM IRRADIATION APPARATUS WITH OVERLAPPING BEAM COLUMNS AND HELPING COLUMNS

CROSS-REFERENCE TO RELATED APPLICATIONS

This application claims the benefit of Japanese Priority Patent Application JP 2019-120613 filed on Jun. 28, 2019, the entire contents of which are incorporated herein by reference.

FIELD

The present invention relates to a multi-column electron beam irradiation apparatus in which a plurality of columns is arranged to be adjacent to each other.

BACKGROUND AND SUMMARY

An electron beam irradiation apparatus is used to improve the etching resistance of a mask by irradiating the mask with an electron beam in the manufacturing process of a semiconductor device, for example. A conventional electron beam irradiation apparatus includes an electron beam generation device that generates an electron beam, a deflector that deflects the electron beam, and an electron beam control unit that controls the electron beam. The deflector is formed by an electrode, for example. The electron beam control unit is formed by a beam scanner that controls the deflector and a deflector power supply that supplies electric power to the deflector, for example (see Japanese Patent Laid-Open No. 2018-133243, for example).

The set of the electron beam generation device, the deflector and the electron beam control unit is sometimes referred to as a "column", and an electron beam irradiation apparatus including a plurality of columns arranged to be adjacent to each other is sometimes referred to as a "multi-column electron beam irradiation apparatus". With the multi-column electron beam irradiation apparatus, the duration of the electron beam irradiation can be reduced compared with an electron beam irradiation apparatus including only one column (a single-column electron beam irradiation apparatus).

However, the requirements for the electron beam irradiation apparatus are becoming severer, and there is a demand for a technique of further reducing the duration of the electron beam irradiation of the multi-column electron beam irradiation apparatus.

The present invention has been devised in view of the problem described above, and an object of the present invention is to provide a multi-column electron beam irradiation apparatus that can reduce the duration of the electron beam irradiation.

An electron beam irradiation apparatus according to an embodiment is a multi-column electron beam irradiation apparatus in which a plurality of columns is arranged to be adjacent to each other, each column including an electron beam generation device that generates an electron beam, a deflector that deflects the electron beam, and a beam scanner that controls the deflector, the electron beam irradiation apparatus including: a storage unit that stores information on a main irradiation area of each column and information on a sub-irradiation area of each column, the main irradiation area of each column being a central part of an irradiation area of the column that can be irradiated with an electron beam by the column, and the sub-irradiation area of each column being a peripheral part of the irradiation area of the column that overlaps with the main irradiation area of a column adjacent to the column; a helping column determination unit that determines, as a helping column, a column having a main irradiation area that is not included in a target irradiation area to be irradiated with an electron beam from among the plurality of columns when information on the target irradiation area is input; and a helped column determination unit that determines, as a helped column for the determined helping column, a column that is adjacent to the helping column and has a main irradiation area included in the target irradiation area from among the plurality of columns, wherein the beam scanner of the helping column performs a helping irradiation control for performing electron beam irradiation in the sub-irradiation area of the helping column, thereby irradiating the target irradiation area of the helped column with an electron beam.

A controlling method for an electron beam irradiation apparatus according to an embodiment is a controlling method for a multi-column electron beam irradiation apparatus in which a plurality of columns is arranged to be adjacent to each other, each column including an electron beam generation device that generates an electron beam, a deflector that deflects the electron beam, and a beam scanner that controls the deflector, and information on a main irradiation area of each column and information on a sub-irradiation area of each column being stored in a storage unit of the electron beam irradiation apparatus, the main irradiation area of each column being a central part of an irradiation area of the column that can be irradiated with an electron beam by the column, and the sub-irradiation area of each column being a peripheral part of the irradiation area of the column that overlaps with the main irradiation area of a column adjacent to the column, the controlling method including: a step of determining, as a helping column, a column having a main irradiation area that is not included in a target irradiation area to be irradiated with an electron beam from among the plurality of columns when information on the target irradiation area is input; and a step of determining, as a helped column for the determined helping column, a column that is adjacent to the helping column and has a main irradiation area included in the target irradiation area from among the plurality of columns, wherein the beam scanner of the helping column performs a helping irradiation control for performing electron beam irradiation in the sub-irradiation area of the helping column, thereby irradiating the target irradiation area of the helped column with an electron beam.

A control program for an electron beam irradiation apparatus according to an embodiment is a control program executed in a multi-column electron beam irradiation apparatus in which a plurality of columns is arranged to be adjacent to each other, each column including an electron beam generation device that generates an electron beam, a deflector that deflects the electron beam, and a beam scanner that controls the deflector, and information on a main irradiation area of each column and information on a sub-irradiation area of each column being stored in a storage unit of the electron beam irradiation apparatus, the main irradiation area of each column being a central part of an irradiation area of the column that can be irradiated with an electron beam by the column, and the sub-irradiation area of each column being a peripheral part of the irradiation area of the column that overlaps with the main irradiation area of a column adjacent to the column, wherein the control program makes the electron beam irradiation apparatus perform: a processing of determining, as a helping column, a column having a main irradiation area that is not included in a target irradiation area to be irradiated with an electron beam from among the plurality of columns when information on the target irradiation area is input; and a processing of determining, as a helped column for the determined helping column, a column that is adjacent to the helping column and has a main irradiation area included in the target irradiation area from among the plurality of columns, and the beam scanner of the helping column performs a helping irradiation control for performing electron beam irradiation in the sub-irradiation area of the helping column, thereby irradiating the target irradiation area of the helped column with an electron beam.

DETAILED DESCRIPTION OF NON-LIMITING EXAMPLE EMBODIMENTS

Figure 1:
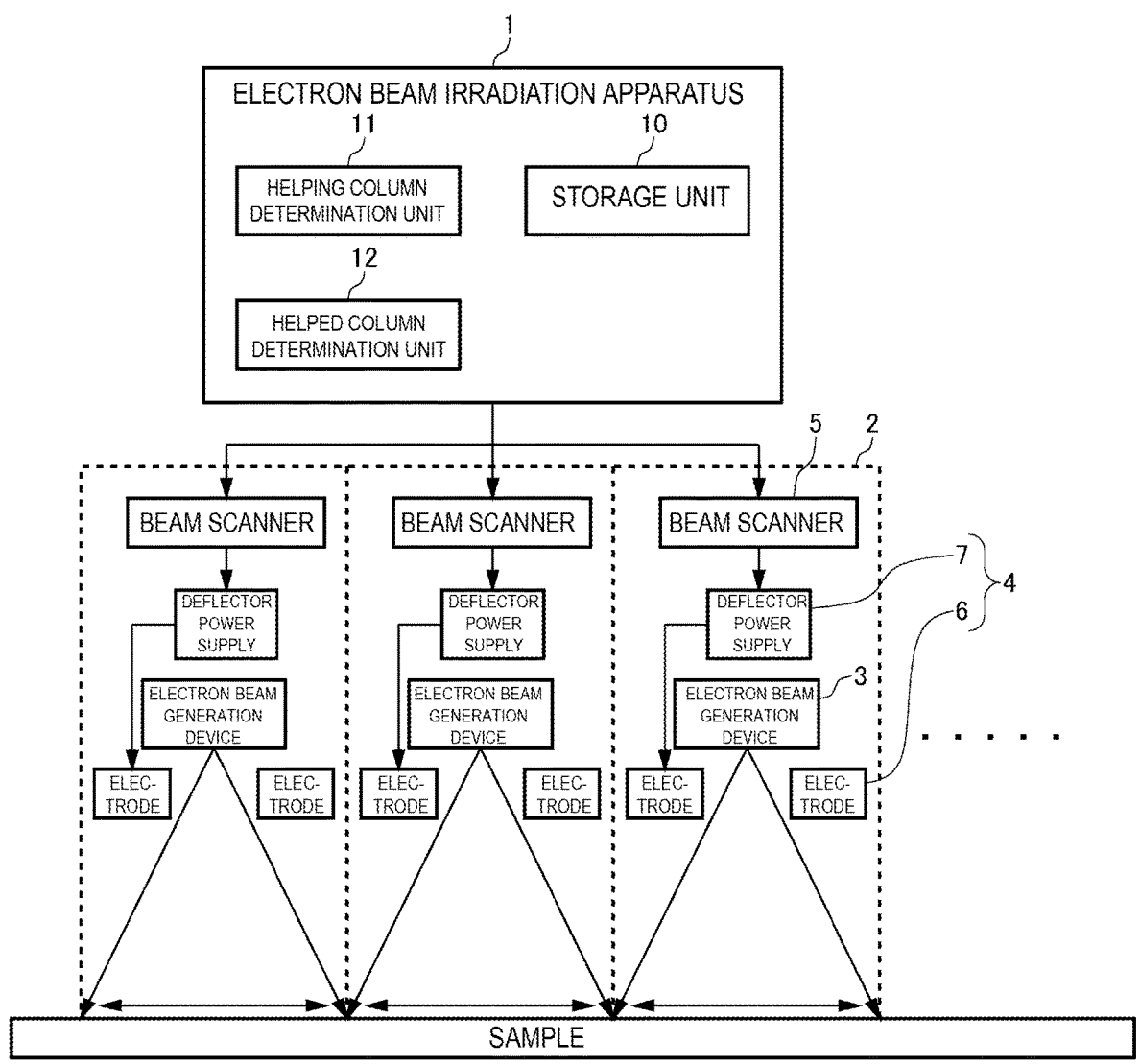
FIG. 1 is a diagram for illustrating a configuration of an electron beam irradiation apparatus according to an embodiment of the present invention.

In the following, an electron beam irradiation apparatus according to an embodiment will be described. Note that the embodiment described below is given to illustrate an example of a mode for carrying out the present technique and is not intended to limit the present technique to the specific configurations described below. The present technique can be carried out with any specific configuration appropriately adopted depending on the implementation.

An electron beam irradiation apparatus according to an embodiment is a multi-column electron beam irradiation apparatus in which a plurality of columns is arranged to be adjacent to each other, each column including an electron beam generation device that generates an electron beam, a deflector that deflects the electron beam, and a beam scanner that controls the deflector, the electron beam irradiation apparatus including: a storage unit that stores information on a main irradiation area of each column and information on a sub-irradiation area of each column, the main irradiation area of each column being a central part of an irradiation area of the column that can be irradiated with an electron beam by the column, and the sub-irradiation area of each column being a peripheral part of the irradiation area of the column that overlaps with the main irradiation area of a column adjacent to the column; a helping column determination unit that determines, as a helping column, a column having a main irradiation area that is not included in a target irradiation area to be irradiated with an electron beam from among the plurality of columns when information on the target irradiation area is input; and a helped column determination unit that determines, as a helped column for the determined helping column, a column that is adjacent to the helping column and has a main irradiation area included in the target irradiation area from among the plurality of columns, wherein the beam scanner of the helping column performs a helping irradiation control for performing electron beam irradiation in the sub-irradiation area of the helping column, thereby irradiating the target irradiation area of the helped column with an electron beam.

With this configuration, in the multi-column electron beam irradiation apparatus in which a plurality of columns is arranged to be adjacent to each other, a helping column and a helped column are appropriately determined, and the target irradiation area of the helped column is irradiated with an electron beam by the helping column performing electron beam irradiation in the sub-irradiation area thereof. Therefore, the target irradiation area can be irradiated with an electron beam by using not only a column having a main irradiation area included in the target irradiation area but also a column having a main irradiation area that is not included in the target irradiation area. As a result, the duration of the electron beam irradiation can be reduced, and the service life of the electron beam generation device can be extended.

In the electron beam irradiation apparatus according to the present invention, when there is a plurality of helped columns for one helping column, the helped column determination unit may determine one helped column from among the plurality of helped columns based on areas of the target irradiation areas of the helped columns and numbers of helping columns adjacent to the helped columns.

With this configuration, even when there is a plurality of helped columns for one helping column, one helped column can be appropriately determined from among the plurality of helped columns based on areas of the target irradiation areas of the helped columns and numbers of helping columns adjacent to the helped columns.

In the electron beam irradiation apparatus according to the present invention, when there is a plurality of helped columns for one helping column, the helped column determination unit may determine a helped column by giving precedence to helped columns orthogonally adjacent to the helping column in plan view over helped columns diagonally adjacent to the helping column in plan view.

With this configuration, even when there is a plurality of helped columns for one helping column, one helped column can be appropriately determined from among the plurality of helped columns by considering the positional relationships between the helping column and the helped columns.

In the electron beam irradiation apparatus according to the present invention, when there is a plurality of helped columns for one helping column, the helped column determination unit may determine a helped column based on doses for the target irradiation areas of the helped columns.

With this configuration, even when there is a plurality of helped columns for one helping column, one helped column can be appropriately determined from among the plurality of helped columns by considering the doses for the target irradiation areas of the helped columns.

In the electron beam irradiation apparatus according to the present invention, when there is a failed column in the plurality of columns, the helped column determination unit may determine the failed column as a helped column.

With this configuration, any failed column can be determined as a helped column, so that a case where there is a failed column in the plurality of columns can be coped with.

A controlling method for an electron beam irradiation apparatus according to an embodiment is a controlling method for a multi-column electron beam irradiation apparatus in which a plurality of columns is arranged to be adjacent to each other, each column including an electron beam generation device that generates an electron beam, a deflector that deflects the electron beam, and a beam scanner that controls the deflector, and information on a main irradiation area of each column and information on a sub-irradiation area of each column being stored in a storage unit of the electron beam irradiation apparatus, the main irradiation area of each column being a central part of an irradiation area of the column that can be irradiated with an electron beam by the column, and the sub-irradiation area of each column being a peripheral part of the irradiation area of the column that overlaps with the main irradiation area of a column adjacent to the column, the controlling method including: a step of determining, as a helping column, a column having a main irradiation area that is not included in a target irradiation area to be irradiated with an electron beam from among the plurality of columns when information on the target irradiation area is input; and a step of determining, as a helped column for the determined helping column, a column that is adjacent to the helping column and has a main irradiation area included in the target irradiation area from among the plurality of columns, wherein the beam scanner of the helping column performs a helping irradiation control for performing electron beam irradiation in the sub-irradiation area of the helping column, thereby irradiating the target irradiation area of the helped column with an electron beam.

With this method, as with the apparatus described above, the target irradiation area can be irradiated with an electron beam by using not only a column having a main irradiation area included in the target irradiation area but also a column having a main irradiation area that is not included in the target irradiation area. As a result, the duration of the electron beam irradiation can be reduced, and the service life of the electron beam generation device can be extended.

A control program for an electron beam irradiation apparatus according to an embodiment is a control program executed in a multi-column electron beam irradiation apparatus in which a plurality of columns is arranged to be adjacent to each other, each column including an electron beam generation device that generates an electron beam, a deflector that deflects the electron beam, and a beam scanner that controls the deflector, and information on a main irradiation area of each column and information on a sub-irradiation area of each column being stored in a storage unit of the electron beam irradiation apparatus, the main irradiation area of each column being a central part of an irradiation area of the column that can be irradiated with an electron beam by the column, and the sub-irradiation area of each column being a peripheral part of the irradiation area of the column that overlaps with the main irradiation area of a column adjacent to the column, wherein the control program makes the electron beam irradiation apparatus perform: a processing of determining, as a helping column, a column having a main irradiation area that is not included in a target irradiation area to be irradiated with an electron beam from among the plurality of columns when information on the target irradiation area is input; and a processing of determining, as a helped column for the determined helping column, a column that is adjacent to the helping column and has a main irradiation area included in the target irradiation area from among the plurality of columns, and the beam scanner of the helping column performs a helping irradiation control for performing electron beam irradiation in the sub-irradiation area of the helping column, thereby irradiating the target irradiation area of the helped column with an electron beam.

With this program, as with the apparatus described above, the target irradiation area can be irradiated with an electron beam by using not only a column having a main irradiation area included in the target irradiation area but also a column having a main irradiation area that is not included in the target irradiation area. As a result, the duration of the electron beam irradiation can be reduced, and the service life of the electron beam generation device can be extended.

In the following, an electron beam irradiation apparatus according to an embodiment of the present invention will be described with reference to the drawings. The electron beam irradiation apparatus according to this embodiment is used in a manufacturing process of a semiconductor device, for example.

A configuration of the electron beam irradiation apparatus according to the embodiment of the present invention will be described with reference to the drawings. FIG. 1 is a diagram for illustrating the electron beam irradiation apparatus according to the embodiment. As shown in FIG. 1, an electron beam irradiation apparatus 1 is a multi-column electron beam irradiation apparatus 1, where a plurality of columns 2 are arranged to be adjacent to each other. Each column 2 includes an electron beam generation device 3 that generates an electron beam, a deflector 4 that deflects the electron beam, and a beam scanner 5 that controls the deflector 4. The deflector 4 is formed by an electrode 6 and a deflector power supply 7, for example.

The electron beam irradiation apparatus 1 further includes a storage unit 10 that stores various kinds of information concerning electron beam irradiation, a helping column determination unit 11 that determines a helping column, and a helped column determination unit 12 that determines a helped column. The helping column determination unit 11 and the helped column determination unit 12 serve as a control unit for controlling the electron beam.

The storage unit 10 stores information on a main irradiation area of each column 2, which is a central part of an irradiation area of the column 2 that can be irradiated with an electron beam by the column 2, and information on a sub-irradiation area of each column 2, which is a peripheral part of the irradiation area of the column 2 that overlaps with the main irradiation area of a column 2 adjacent to the column 2.

Figure 2:
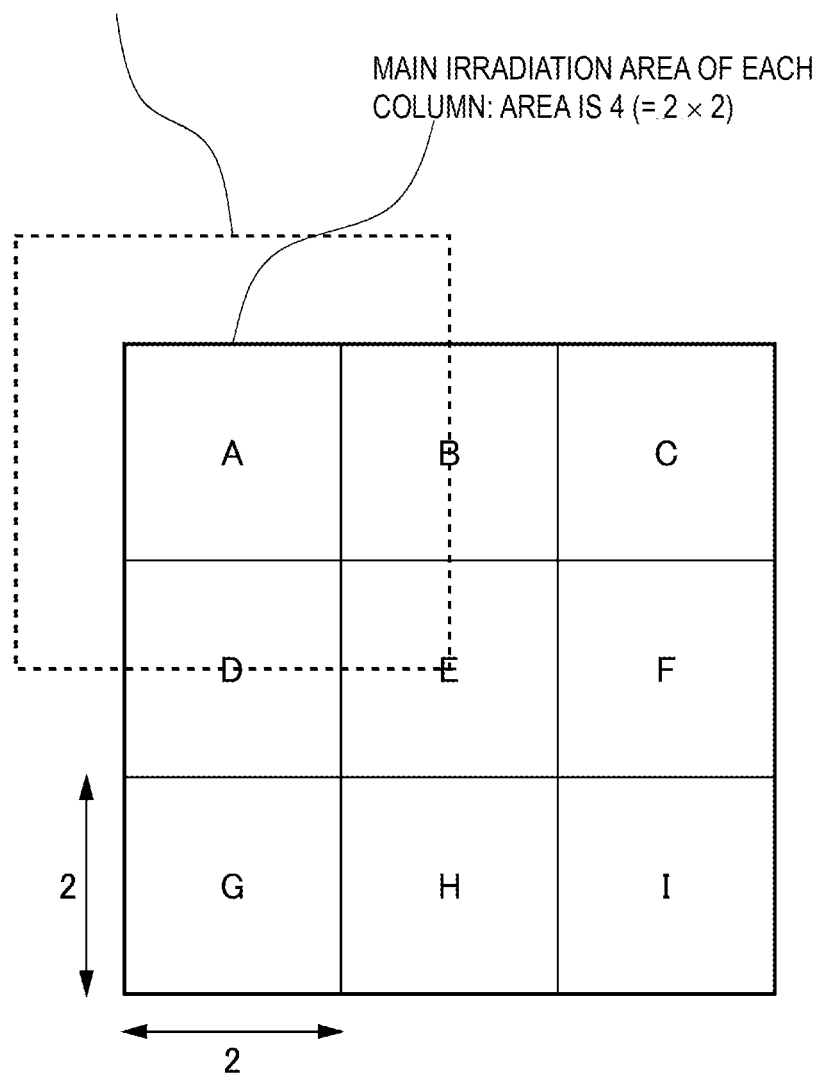
FIG. 2 is a diagram showing an example of an irradiation area of a column according to the embodiment of the present invention.

FIG. 2 is a diagram showing an example of the irradiation area of the column 2. In the example in FIG. 2, the electron beam irradiation apparatus 1 has nine (three by three) columns 2 (columns A to I). As shown in FIG. 2, it is supposed that that each column 2 has an area of 4 (=2×2), and the area of the irradiation area of each column 2 that can be irradiated by the column 2 is 16 (=4×4), for example. In this case, in the irradiation area of each column 2, the main irradiation area is a central part (a part having an area equal to the area of the column 2), and the sub-irradiation area is a peripheral part (an area that is the remainder of the irradiation area surrounding the main irradiation area). The sub-irradiation area overlaps with the main irradiation area of a column 2 (the column B, for example) adjacent to the column 2 (the column A, for example). In the example in FIG. 2, the main irradiation area has an area of 4 (=2×2), and the sub-irradiation area has an area of 12 (=16-4).

In response to receiving information on a target irradiation area to be irradiated with an electron beam, the helping column determination unit 11 determines, as a helping column, a column 2 of the plurality of columns 2 that has a main irradiation area that is not included in the target irradiation area.

For the determined helping column, the helped column determination unit 12 determines, as a helped column, a column 2 of the plurality of columns 2 that is adjacent to the helping column and has a main irradiation area included in the target irradiation area. When there is a plurality of helped columns for one helping column, the helped column determination unit 12 determines one helped column from among the plurality of helped columns based on the areas of the target irradiation areas of the helped columns, the numbers of helping columns adjacent to the helped columns, and the doses for the target irradiation areas of the helped columns.

When there is a plurality of helped columns for one helping column, the helped column determination unit 12 determines a helped column by giving precedence to helped columns orthogonally adjacent to the helping column over helped column diagonally adjacent to the helping column in plan view. Furthermore, if there is a failed column 2 in the plurality of columns 2, the helped column determination unit 12 determines the failed column 2 as a helped column.

Figure 3:
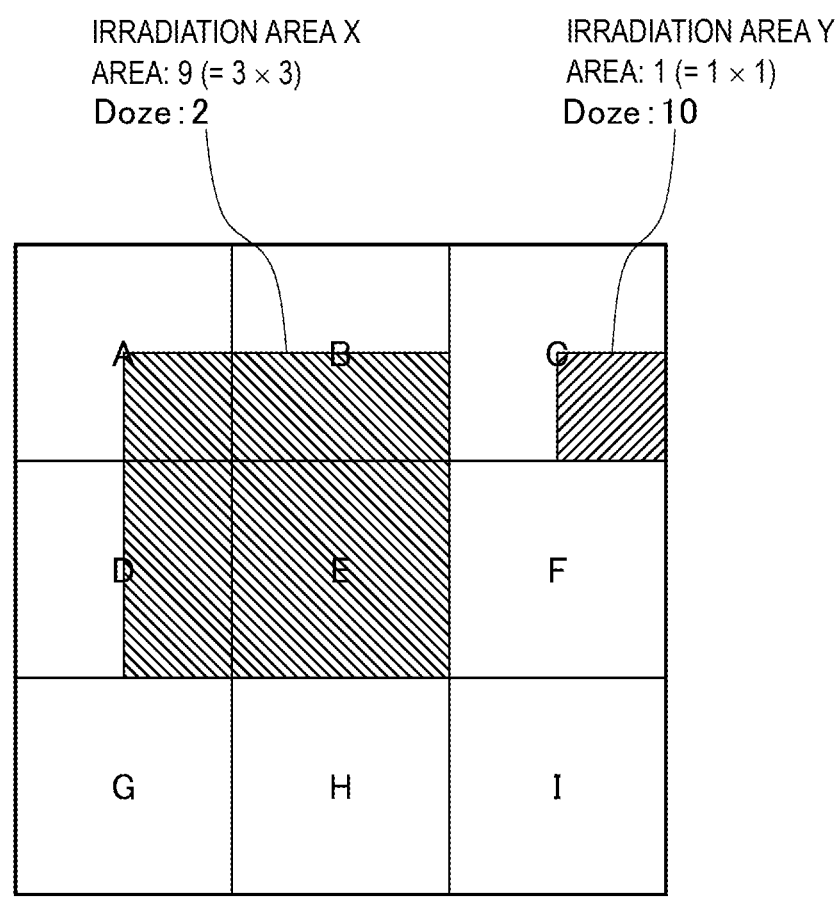
FIG. 3 is a diagram showing an example of target irradiation areas according to the embodiment of the present invention.

FIG. 3 is a diagram showing an example of target irradiation areas. For example, when information on the target irradiation areas shown in FIG. 3 is input, the helping column determination unit 11 determines, as helping columns, columns 2 (the columns F, G, H and I) having a main irradiation area that is not included in the target irradiation areas from among the plurality of columns (the columns A to I).

The helped column determination unit 12 determines a helped column for which each of the helping columns (the columns F, G, H and I) provides the electron beam irradiation in the sub-irradiation area thereof. For example, for the column F, there is a plurality of candidate helped columns (the columns B, C and E). In this case, the columns C and E, which are orthogonally adjacent to the column F in plan view, are given precedence over the column B, which is diagonally adjacent to the column F in plan view (see FIG. 3).

The helped column determination unit 12 calculates a determination reference value for the plurality of candidate helped columns (the columns C and E) as described below, and determines the column 2 having the maximum determination reference value as a helped column.

$$\text{Determination reference value} = (M \times D)/(N+1)$$

In this formula, M denotes the area of the target irradiation area of the helped column, and D denotes the dose for the target irradiation area of the helped column. N denotes the number of the helping columns orthogonally adjacent to the helped column in plan view.

The area M of the target irradiation area of the column C is 1 (=1×1), and the dose D of the target irradiation area of the column C is 10. The number N of the helping columns orthogonally adjacent to the column C in plan view is 1 (only the column F). Therefore, the determination reference value for the column C is 5 (=(1×10)/(1+1)).

On the other hand, the area M of the target irradiation area of the column E is 4 (=2×2), and the dose D of the target irradiation area of the column E is 2. The number N of the helping columns orthogonally adjacent to the column E in plan view is 2 (the columns F and H). Therefore, the determination reference value for the column E is 2.6 (=(4×2)/(2+1)).

Thus, the helped column determination unit 12 determines the column C, which has a greater determination reference value, as a helped column for the column F. The helped column determination unit 12 determines a helped column for the columns G, H and I in the same manner. If a plurality of columns 2 has the maximum determination reference value, a helped column may be randomly determined from among the columns 2. Alternatively, a helped column may be determined according to a predetermined rule (such as in a clockwise order) from among the columns 2.

In the electron beam irradiation apparatus 1 according to this embodiment, the beam scanner 5 of the helping column performs a helping irradiation control for performing electron beam irradiation in the sub-irradiation area of the helping column to irradiate the target irradiation area of the helped column with an electron beam.

Figure 4:
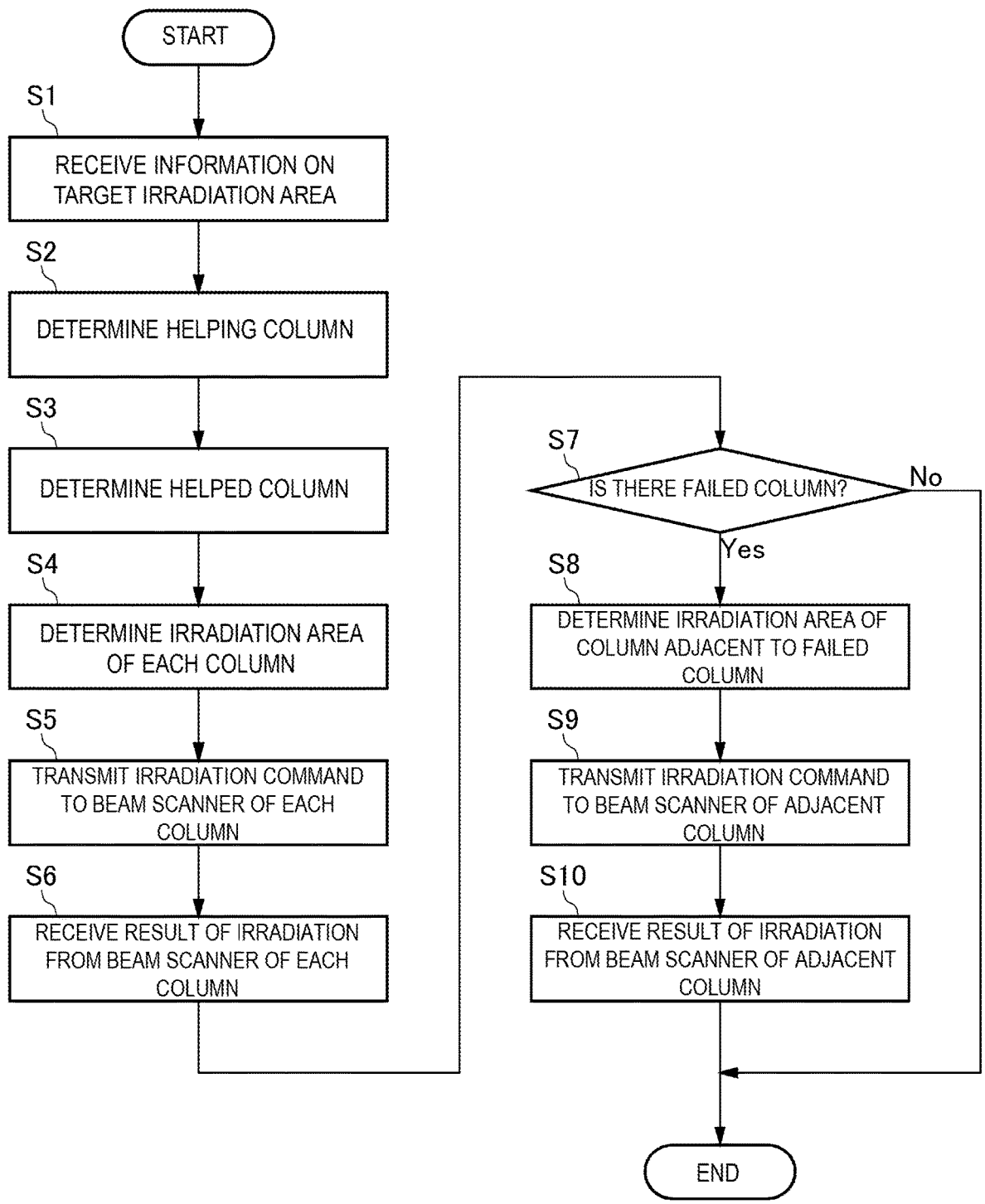
FIG. 4 is a flow diagram for illustrating an operation of the electron beam irradiation apparatus according to the embodiment of the present invention.

An operation of the electron beam irradiation apparatus 1 configured as described above will be described with reference to the flow diagram in FIG. 4.

In the electron beam irradiation by the electron beam irradiation apparatus 1 according to this embodiment, when information on a target irradiation area to be irradiated with an electron beam is input (S1), a column 2 having a main irradiation area that is not included in the target irradiation area is determined as a helping column (S2). For the determined helping column, a column 2 that is adjacent to the helping column and has a main irradiation area included in the target irradiation area is determined as a helped column (S3). After the irradiation area of each column 2 is determined (S4), an electron beam irradiation command is transmitted to the beam scanner 5 of each column 2 (S5). Each column 2 performs electron beam irradiation according to the irradiation command.

After that, the control unit receives the result of the electron beam irradiation from the beam scanner 5 of each column 2 (S6). If the irradiation results show that there is a failed column (a column 2 that has failed) and the column 2 has failed to perform electron beam irradiation (S7), a column 2 (helping column) adjacent to the failed column (helped column) is determined, the irradiation area of the adjacent column 2 is determined (S8), and an electron beam irradiation command is transmitted to the beam scanner 5 of the adjacent column (S9). The column adjacent to the failed column performs electron beam irradiation on behalf of the failed column according to the irradiation command. After that, the control unit receives the result of the electron beam irradiation from the beam scanner 5 of the adjacent column (S10) and confirms that the electron beam irradiation has been performed on behalf of the failed column.

With the electron beam irradiation apparatus 1 according to this embodiment configured as described above, which is a multi-column electron beam irradiation apparatus in which a plurality of columns 2 are arranged to be adjacent to each other, a helping column and a helped column are appropriately determined, and the helping column irradiates the target irradiation area of the helped column with an electron beam by using the electron beam irradiation in the sub-irradiation area thereof. In this way, the target irradiation area can be irradiated with an electron beam by using not only the column 2 having a main irradiation area included in the target irradiation area but also a column 2 having a main irradiation area that is not included in the target irradiation area. As a result, the duration of the electron beam irradiation can be reduced, and the service life of the electron beam generation device 3 can be extended.

According to this embodiment, even when there is a plurality of helped columns for one helping column, one helped column can be appropriately determined from among the plurality of helped column by considering the areas of the target irradiation areas of the helped columns and the numbers of helping columns that are adjacent to the helped columns.

According to this embodiment, even when there is a plurality of helped columns for one helping column, one helped column can be appropriately determined from among the plurality of helped column by considering the positional relationships between the helping column and the helped columns.

According to this embodiment, even when there is a plurality of helped columns for one helping column, one helped column can be appropriately determined from among the plurality of helped column by considering the doses for the target irradiation areas of the helped columns.

According to this embodiment, any failed column 2 can be determined as a helped column, so that a case where there is a failed column 2 in a plurality of columns 2 can be coped with.

Although an embodiment of the present invention has been described for illustrative purposes, the scope of the present invention is not limited to the embodiment, and various modifications and alterations are possible as required within the scope set forth in the claims.

REFERENCE SIGNS LIST

1 electron beam irradiation apparatus
2 column
3 electron beam generation device
4 deflector
5 beam scanner
6 electrode
7 deflector power supply
10 storage unit
11 helping column determination unit
12 helped column determination unit

What is claimed is:

1. A multi-column electron beam irradiation apparatus comprising:
    a plurality of columns arranged to be adjacent to each other, each column comprising:
    an electron beam generation source that generates an electron beam respectively;
    a deflector that deflects the electron beam respectively; and
    a beam scanner that controls the deflector respectively;
    a storage that stores information on a main irradiation area of each column and information on a sub-irradiation area of each column, the main irradiation area of each column being a central part of an irradiation area of the column that can be irradiated with an electron beam by the column, and the sub-irradiation area of each column being a peripheral part of the irradiation area of the column that overlaps with the main irradiation area of a column adjacent to the column; and
    a controller configured to:
    determine, as a helping column, a column having a main irradiation area that is not included in a target irradiation area to be irradiated with an electron beam from among the plurality of columns when information on the target irradiation area is input; and
    determine, as a helped column for the determined helping column, a column that is adjacent to the helping column and has a main irradiation area included in the target irradiation area from among the plurality of columns,
    wherein the beam scanner of the helping column performs a helping irradiation control for performing electron beam irradiation in the sub-irradiation area of the helping column, thereby irradiating the target irradiation area of the helped column with an electron beam,
    wherein the irradiation area of the helped or helper column does not move during the electron beam irradiation,
    wherein the deflector of the helping column is separately operated from the deflector of the helped column when the electron beam irradiation to the helped column is conducted, and
    wherein the main irradiation area of the helping column is not irradiated by the plurality of columns.

2. The electron beam irradiation apparatus according to claim 1, wherein when there is a plurality of helped columns for one helping column, the controller determines one helped column from among the plurality of helped columns based on areas of the target irradiation areas of the helped columns and numbers of helping columns adjacent to the helped columns.

3. The electron beam irradiation apparatus according to claim 2, wherein when there is a plurality of helped columns for one helping column, the controller determines a helped column by giving precedence to helped columns orthogonally adjacent to the helping column in plan view over helped columns diagonally adjacent to the helping column in plan view.

4. The electron beam irradiation apparatus according to claim 2, wherein when there is a plurality of helped columns for one helping column, the controller determines a helped column based on doses for the target irradiation areas of the helped columns.

5. The electron beam irradiation apparatus according to claim 1, wherein when there is a failed column in the plurality of columns, the controller determines the failed column as a helped column.

6. A controlling method for a multi-column electron beam irradiation apparatus in which a plurality of columns is arranged to be adjacent to each other,
    each column comprising an electron beam generation source that generates an electron beam respectively, a deflector that deflects the electron beam respectively, and a beam scanner that controls the deflector respectively, and
    information on a main irradiation area of each column and information on a sub-irradiation area of each column being stored in a storage of the electron beam irradiation apparatus, the main irradiation area of each column being a central part of an irradiation area of the column that can be irradiated with an electron beam by the column, and the sub-irradiation area of each column being a peripheral part of the irradiation area of the column that overlaps with the main irradiation area of a column adjacent to the column,
    the controlling method comprising:
    a step of determining, as a helping column, a column having a main irradiation area that is not included in a target irradiation area to be irradiated with an electron beam from among the plurality of columns when information on the target irradiation area is input; and
    a step of determining, as a helped column for the determined helping column, a column that is adjacent to the helping column and has a main irradiation area included in the target irradiation area from among the plurality of columns,
    wherein the beam scanner of the helping column performs a helping irradiation control for performing electron beam irradiation in the sub-irradiation area of the helping column, thereby irradiating the target irradiation area of the helped column with an electron beam, wherein the irradiation area of the helped or helper column does not move during the electron beam irradiation, wherein the deflector of the helping column is separately operated from the deflector of the helped column when the electron beam irradiation to the helped column is conducted, and wherein the main irradiation area of the helping column is not irradiated by the plurality of columns.

7. A control program executed in a multi-column electron beam irradiation apparatus in which a plurality of columns is arranged to be adjacent to each other, each column comprising an electron beam generation source that generates an electron beam respectively, a deflector that deflects the electron beam respectively, and a beam scanner that controls the deflector respectively, and information on a main irradiation area of each column and information on a sub-irradiation area of each column being stored in a storage of the electron beam irradiation apparatus, the main irradiation area of each column being a central part of an irradiation area of the column that can be irradiated with an electron beam by the column, and the sub-irradiation area of each column being a peripheral part of the irradiation area of the column that overlaps with the main irradiation area of a column adjacent to the column, wherein the control program makes the electron beam irradiation apparatus perform:

a processing of determining, as a helping column, a column having a main irradiation area that is not included in a target irradiation area to be irradiated with an electron beam from among the plurality of columns when information on the target irradiation area is input; and a processing of determining, as a helped column for the determined helping column, a column that is adjacent to the helping column and has a main irradiation area included in the target irradiation area from among the plurality of columns, and the beam scanner of the helping column performs a helping irradiation control for performing electron beam irradiation in the sub-irradiation area of the helping column, thereby irradiating the target irradiation area of the helped column with an electron beam, wherein the irradiation area of the helped or helper column does not move during the electron beam irradiation, wherein the deflector of the helping column is separately operated from the deflector of the helped column when the electron beam irradiation to the helped column is conducted, and wherein the main irradiation area of the helping column is not irradiated by the plurality of columns.

\* \* \* \* \*